United States Patent [19]

Hoberman

[11] Patent Number: 4,725,979

[45] Date of Patent: Feb. 16, 1988

[54] EMITTER COUPLED LOGIC CIRCUIT HAVING FUSE PROGRAMMABLE LATCH/REGISTER BYPASS

[75] Inventor: Barry A. Hoberman, Mountain View, Calif.

[73] Assignee: Monolithic Memories, Inc., Santa Clara, Calif.

[21] Appl. No.: 938,480

[22] Filed: Dec. 5, 1986

[51] Int. Cl.⁴ .............................................. G11C 11/40
[52] U.S. Cl. ...................................... 365/96; 365/179; 307/455
[58] Field of Search ................. 365/96, 155, 177, 179; 307/455

[56] References Cited

U.S. PATENT DOCUMENTS 4,099,070  7/1978  Reinert ................................. 365/155
4,464,735  8/1984  Toyoda et al. ....................... 365/155

Primary Examiner—James W. Moffitt
Attorney, Agent, or Firm—Nathan N. Kallman; Alan H. MacPherson

[57] ABSTRACT

An emitter coupled logic circuit includes a bypass circuit which provides a conductive path for current when a programmable fuse is blown, so that input data is transmitted independently of the state of a clock signal. In one implementation, the circuit takes a register configuration having a master section and a slave section, each incorporating a programmable fuse. When the fuse in just one section is intact, the circuit serves as a clocked latch. When both fuses are blown, the bypass circuit is enabled so that the register functions as a combinatorial circuit which produces an output signal dependent on the input signal without reference to a clock signal.

7 Claims, 4 Drawing Figures

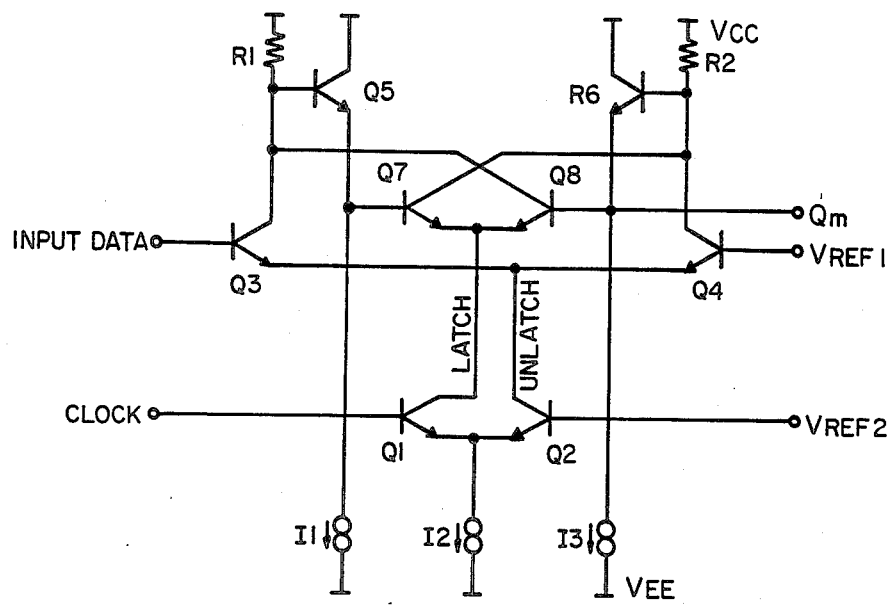
FIG_1
(PRIOR ART)
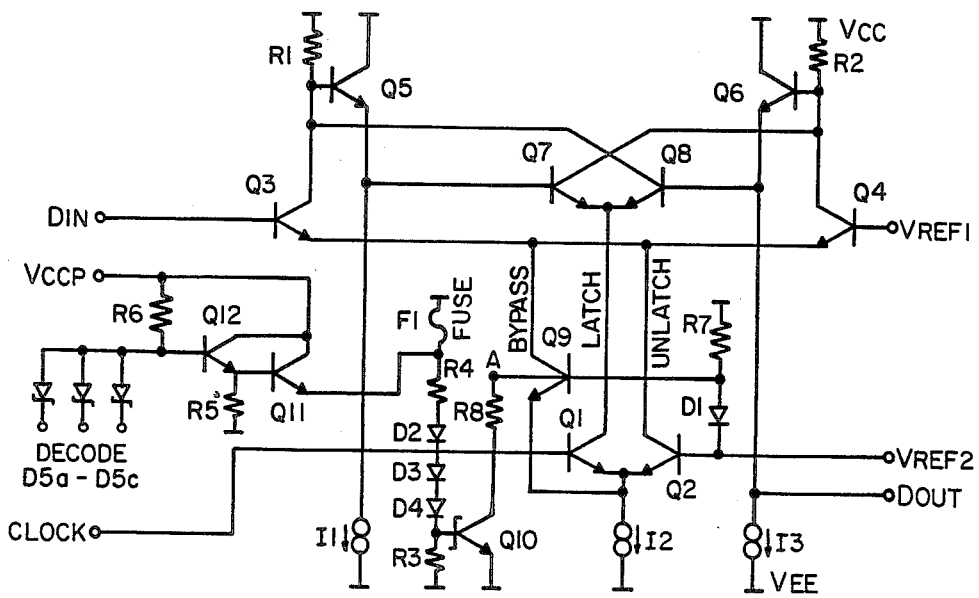
FIG_3

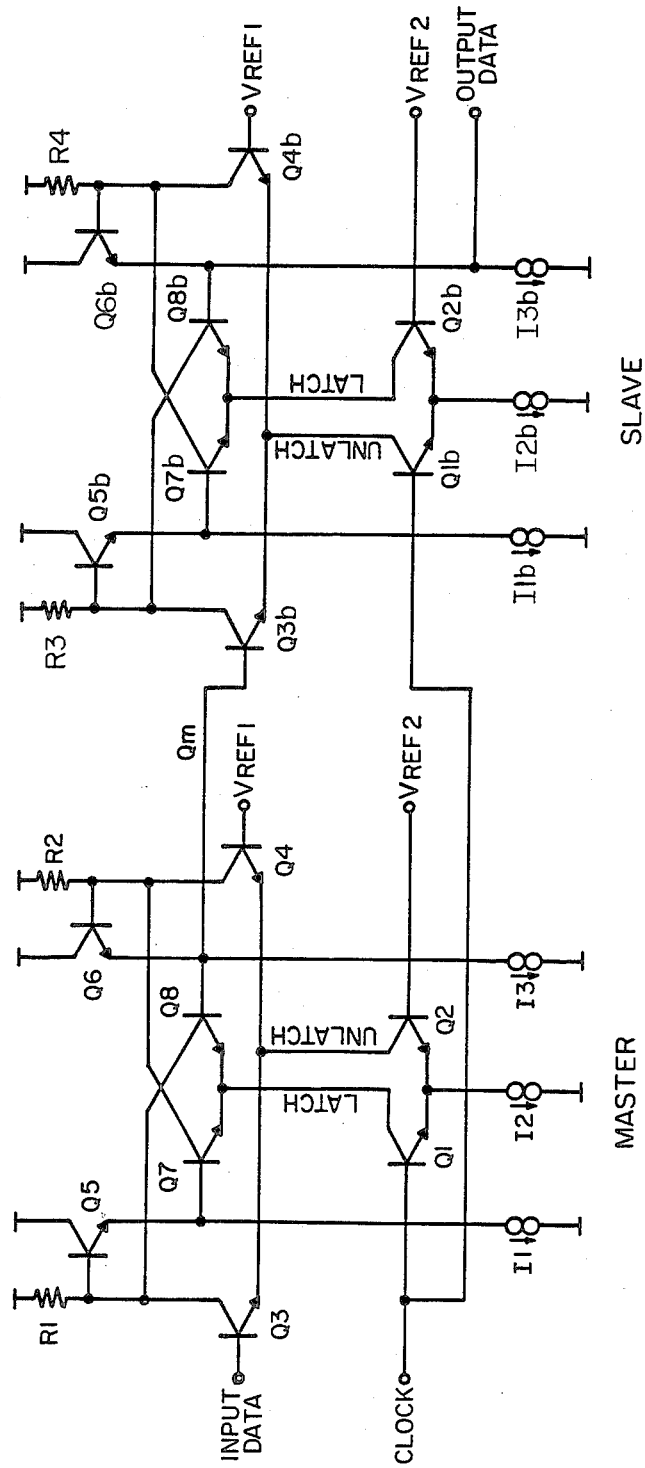
FIG_2
(PRIOR ART)

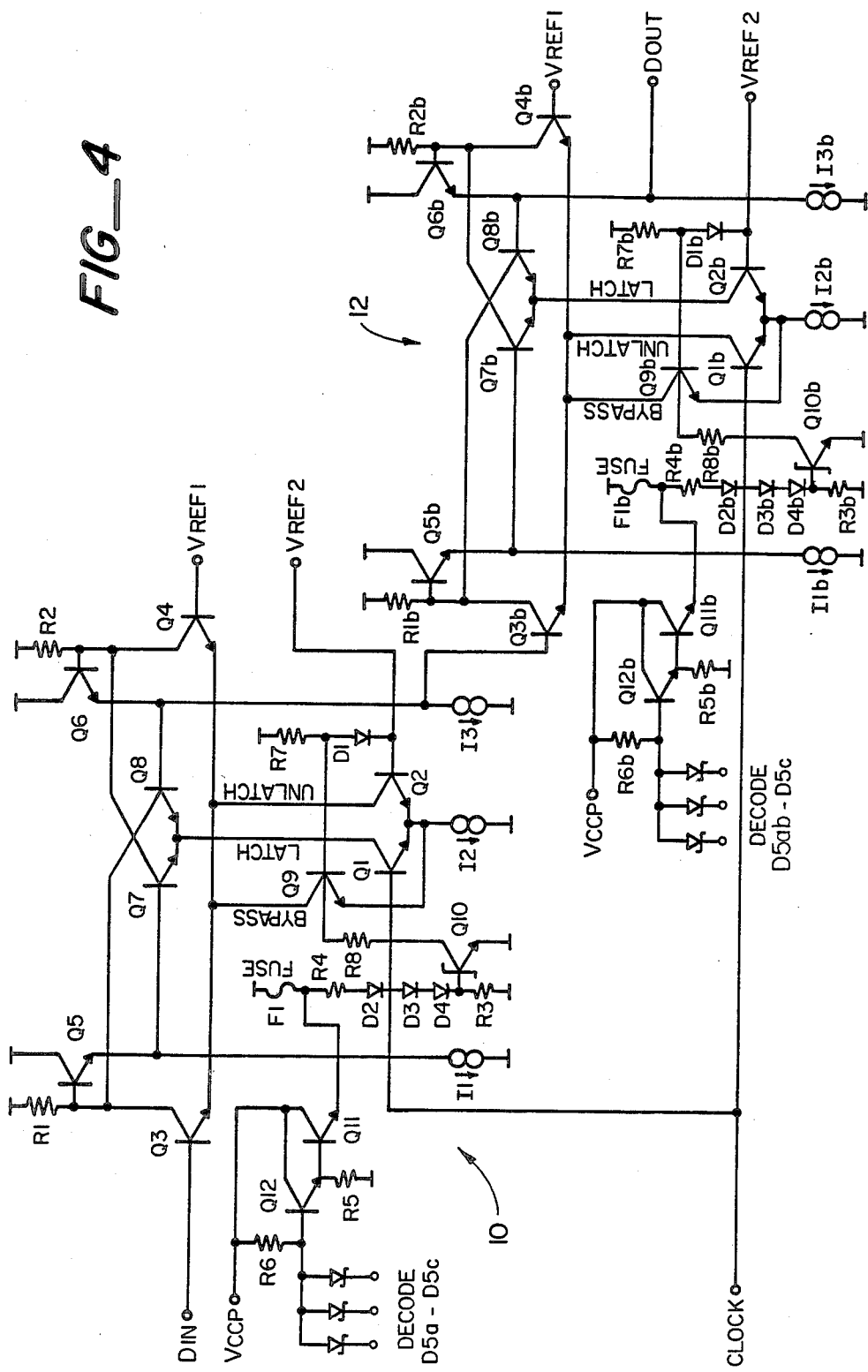
FIG_4

EMITTER COUPLED LOGIC CIRCUIT HAVING FUSE PROGRAMMABLE LATCH/REGISTER BYPASS

BACKGROUND OF THE INVENTION

1. Field of the Invention

This invention relates to a data storage element and in particular to an emitter coupled logic (ECL) circuit having a fuse programmable latch/register bypass circuit.

2. Description of the Prior Art

Latch circuits are used generally as storage elements to store binary data received from an input data source. A latch is a logic function having an output that remains at a particular logic level after it has been forced to that state by an external signal. The latch output remains at that level even though the external signal that forced the latch to its state is no longer present. A clocked latch is a latch circuit having a state that is only changeable when a clock signal is in a given state, and the latch retains its current state until the clock signal changes polarity and allows entry to a new state. Two clocked latch circuits may be configured as master and slave sections connected in series, with the clock input of the slave section being the complement of the clock applied to the master section to form a clocked register. In prior art logic circuits, the data output of the latch circuit is dependent upon the clock input signal.

It would be desirable to utilize a latch circuit but to change its function so that it acts merely as a buffer and does not latch, even upon the application of clock signals of both states, i.e., high or low, whereby the output signal is a combinatorial signal as opposed to a clocked signal. Thus, the combinatorial signal is always a direct function of the current data input signal.

SUMMARY

An object of this invention is to provide a fuse programmable latch/register logic circuit for producing a data output that is latched/registered or combinatorial, depending on the state of the fuse.

According to this invention, a latch/register logic circuit comprises emitter coupled transistors having a common emitter circuit tied to a current source. The circuit includes a fuse, which when it is intact, allows the latch circuit to latch in response to a clock signal. When the fuse is blown in response to a programming decode circuit, the logic circuit is permanently unlatched and bypassed. In one implementation, an ECL register having master and slave sections incorporates fuse programmable bypass circuits. If the fuse in the master latch section only is blown, the register is converted to function as a latch when a clock signal is at one polarity; when the fuse in the slave latch circuit only is blown, the register is converted to function as a latch when the clock signal is of the opposite polarity. However, if both fuses are blown, the register is completely bypassed and functions as a combinatorial circuit with an output value depending only upon the data input values.

BRIEF DESCRIPTION OF THE DRAWINGS

The invention will be described with reference to the drawings in which:

FIG. 1 is a schematic circuit diagram of an emitter coupled logic (ECL) compatible clocked latch configuration, according to the prior art;

FIG. 2 is a schematic circuit diagram of a prior art configuration of a clocked data storage register employing the latch configuration of FIG. 1;

FIG. 3 is a schematic circuit diagram of an ECL clocked latch circuit, made in accordance with this invention; and FIG. 4 is a schematic circuit diagram of a clocked data storage register employing the latch configuration of FIG. 3.

DETAILED DESCRIPTION

With reference to FIG. 1, an ECL circuit made in accordance with the prior art comprises emitter coupled transistor pairs Q1 and Q2, Q3 and Q4, Q7 and Q8, and a pair of transistors Q5 and Q6 having their emitters connected to the bases of Q7 and Q8, respectively. During operation of the circuit, a source of current $I_2$ is applied to the common emitter circuit of transistors Q1 and Q2. A reference voltage $V_{REF2}$ is applied to the base of the transistor Q2 and a reference voltage $V_{REF1}$ is applied to the base of transistor Q4. In this implementation, a typical value for $V_{REF1}$ would be $V_{cc}-1.3$ volts, and for $V_{REF2}$, $V_{cc}-2.9$ volts, where $V_{cc}$ is approximately 5 volts. $V_{EE}$ is at ground potential. The data input signal $D_{in}$ is in the range of $-1.8$ to $-0.9$ volts and the clock signal is provided at $-3.3$ to $-2.5$ volts, relative to $V_{cc}$.

When a clock input signal that is applied to the base of Q1 is low, transistor Q1 is nonconducting and turned off. The latch circuit is unlatched and acts as a transparent data buffer so that no data is stored in memory. During the time that the clock signal is low the emitter circuits of transistors Q7 and Q8 see a high impedance at the collector of Q1. The collectors of Q7 and Q8 present a high impedance load to the collector circuits of Q3 and Q4. Therefore, transistors Q7 and Q8 are turned off when the clock is in its low state. Thus, when the clock input signal is low, the current source $I_2$ passes through the collector of Q2 to activate the emitter coupled transistors Q3 and Q4, which have their common emitters coupled to the collector of Q2. The state of the data input signal that is supplied to the base of Q3 turns the transistors Q3 and Q4 on and off in a complementary sequence. For example, if the input data to Q3 is in the high state, all of the $I_2$ current is applied across the resistor R1 in the collector circuit of transistor Q3, whereas if the input data signal is in the low state, then the $I_2$ current appears across resistor R2 that is tied to the collector of transistor Q4.

With the clock input signal in its high state, the $I_2$ current source provides current to the Q1 emitter and a current source (i.e., $I_2$) load appears at the emitters of Q7 and Q8. The data signal is directed through the collector circuits of transistors Q7 and Q8, by virtue of regenerative feedback, to the base electrodes of Q5 and Q6. Current sources $I_1$ and $I_3$ serve to load the emitters of transistors Q5 and Q6. The emitters of Q5 and Q6 drive the base electrodes of Q7 and Q8 to provide a level shifting function. The emitter follower transistors Q5 and Q6, which serve as the level shifters, follow the signals appearing at the Q3 and Q4 collectors.

At the time of the transition of the clock input signal from a low to a high state, if the data input signal is high and the Q3 collector is low, then the collector of Q4 is high. At such time, the base electrode of Q7 is low relative to the Q8 base. As the I2 current begins to flow through the coupled emitters of Q7 and Q8, the transistor Q8 turns on and transistor Q7 stays off. When transistor Q8 is turned on, the Q3 collector is held in its low state, and because Q7 remains off, the Q4 collector remains high. The collectors of Q3 and Q4 determine the voltages at the bases of Q7 and Q8. The emitter coupled circuit provides positive, or regenerative, feedback and the latch circuit holds its state after the clock goes high, regardless of changes in input data because the coupled emitters of Q3 and Q4 see a high impedance at the Q2 collector. Further changes in the value of the input data signal do not affect the state of the latch unless a low clock signal is provided to change the value stored in the latch.

In FIG. 2, a prior art data storage register circuit is illustrated having master and slave latch sections operating in a complementary manner in response to the positive and negative portions of the clock input signal. Each section operates substantially in the same manner as the latch described with reference to FIG. 1, and is dependent upon the clock input signal to provide an output data signal. When the clock input is low, the master latch section is unlatched and the slave latch section is latched, and conversely when the clock input signal is high, the master latch section is latched and the slave section is unlatched.

As depicted in FIG. 3, an emitter coupled logic circuit incorporating the invention includes pairs of emitter coupled transistors Q1 and Q2, Q3 and Q4, Q7 and Q8, and a pair of transistors Q5 and Q6 having their emitters connected to the bases of Q7 and Q8, respectively. The logic circuit includes a bypass circuit having a transistor Q9 with its emitter coupled to the current source I2 and its base coupled to a programmable fuse F1 and a biasing circuit through a transistor Q10 and resistor R8. The biasing circuit comprises diodes D2, D3 and D4, and resistors R3 and R4 connected in series with the fuse.

During operation of the circuit of FIG. 3, if the fuse F1 is intact, transistor Q10 which is coupled to the fuse through the biasing circuit is turned on. The node A between resistor R8 in the collector circuit of Q10 and the base electrode of Q9 is held at a very low voltage, typically about 0.8V above $V_{EE}$. As a result, Q9 is turned off and diode D1, which is connected to the base of Q9 is reverse biased so that transistor Q9 cannot be turned on and remains nonconducting.

As described with reference to FIG. 1, when the clock input signal that is supplied to Q1 is low, the emitter circuits of Q7 and Q8 see a high impedance at the collector of Q1, and the collectors of Q7 and Q8 present a high impedance load to the collector circuits of Q3 and Q4. Transistors Q7 and Q8 are turned off and transistor Q1 is turned off. In this mode, the circuit is unlatched so that no data is stored.

When the clock input signal that appears at the base of Q1 is high, the current from source I2 is passed through the common emitter circuit of Q1 and Q2. A current source load is presented to the emitter circuit of Q7 and Q8 which is tied to the Q1 collector. The emitters of Q5 and Q6 drive the base electrodes of Q7 and Q8, and serve as a level shifter.

At the time of a clock transition from the low to the high state, if the data input signal is high, then the Q3 collector is low and the Q4 collector is high. In such case, the Q7 base is driven low relative to the Q8 base. As the I2 current begins to flow through the coupled emitters of Q7 and Q8, transistor Q8 turns on and the Q7 stays off. If Q8 is on, the Q3 collector is held low, and the Q4 collector is high. The Q3 and Q4 collectors determine the base voltages of Q7 and Q8, so that regenerative feedback is obtained. The latch holds its state regardless of changes in the data input signal, since the coupled Q3 and Q4 emitters are looking at the high impedance of the Q2 collector.

In keeping with this invention, a decode circuit comprising Schottky diodes D5a–D5c enables blowing the fuse F1 which is coupled to the decode circuit through transistors Q12 and Q11. When the fuse is blown (i.e., high impedance), transistor Q10 is turned off and node A rises to a voltage of one diode D1 (about 0.8V) above reference voltage $V_{REF2}$, i.e., about $V_{cc}-2.1V$. The clock input signal and the voltage reference signal at $V_{REF2}$ cannot rise above the voltage at node A. Thus, transistor Q9, which forms a bypass loop between current source I2 and the common emitter circuit of Q3 and Q4, has a higher base voltage than that appearing at the bases of Q1 and Q2 within normal circuit operating conditions. The I2 current is always directed through the emitter circuit of Q9 and Q1 and Q2 are permanently off. The collector circuit of Q9 is connected to the common emitter circuit of Q3 and Q4 and forces the latch to assume a permanent transparent state. As a result, the latch circuit disregards the clock input signal and responds only to the data input signal.

FIG. 4 illustrates an ECL circuit having a master latch circuit section 10 and a slave circuit section 12. The two sections are virtually identical, including programmable fuses F1 and F1b respectively. Each section acts as a latch, with the clock signal of alternating polarity driving each latch alternately into the latched or transparent mode, so that the latches are in opposite modes. When the fuse F1 only is blown by the decode circuit including diodes D5a–D5c and the fuse F1b in the slave circuit is intact, the register is converted to function as a latch which holds data when the clock signal is low. If only the fuse F1b is blown and the master section fuse F1 is intact, the register is converted to function as a latch which holds data when the clock signal is high. When both fuses F1 and F1b are blown, then the register is completely bypassed so that the logic circuit is combinatorial whereby the output data signal $D_{out}$ has a value dependent only upon the data input signal and is not clock dependent. By virtue of the novel circuit disclosed herein, a data register is bypassed to function as a combinatorial circuit in an expedient manner.

It should be understood that the invention is not limited to the particular parameters or circuit arrangements set forth herein, but may be modified within the scope of the invention. For example, the voltages and the circuit network for generating reference and/or clock voltages, as well as the configuration of the fuse network, may be varied by one skilled in the art to implement the invention.

What is claimed is:

1. A programmable logic circuit for storing data comprising:
   a first transistor and a second transistor, each having emitter base and collector electrodes, the emitters of said first and second transistors being connected in a common emitter circuit;
   a first current source for applying current to the common emitter circuit of said first and second transistors;

means for applying a clock signal to the base of said first transistor;

means for applying a first reference voltage to the base of said second transistor;

a third transistor and a fourth transistor, each having emitter, base and collector electrodes, the emitters of said third and fourth transistors being connected;

means for applying a data input signal to the base of said third transistor;

means for applying a second reference voltage to the base of said fourth transistor;

a bypass circuit coupled at one end to a junction between said current source and the common emitter circuit of said first and second transistors and coupled at the other end to the common emitter circuit of said third and fourth transistors;

a programmable circuit including a fuse coupled to said bypass circuit, so that the state of the fuse determines whether the function of the logic circuit is combinatorial or latched.

2. A programmable logic circuit as in claim 1, wherein said bypass circuit comprises a transistor having its emitter coupled to said current source and having its collector coupled to the common emitter circuit of said third and fourth transistors, and having its base connected to a reference voltage source.

3. A programmable logic circuit as in claim 1, including means for blowing said fuse, said fuse blowing means comprising programmable decode means and serially connected transistors coupled to said fuse.

4. A programmable logic circuit as in claim 3, wherein said decode means comprises a plurality of Schottky diodes.

5. A programmable logic circuit as in claim 1, including biasing diodes coupled to said fuse.

6. A programmable logic circuit as in claim 1, including second and third current sources;

a fifth transistor and a sixth transistor having respectively base and collector electrodes and emitters, said emitters of said fifth and sixth transistors being coupled to said second and third current sources respectively, and the base of said fifth and sixth transistors being coupled to the collector circuits of said third and fourth transistors respectively;

seventh and eighth transistors having respectively base and collector electrodes and coupled emitters that are connected to the collectors of said first and second transistors, and having their bases connected to the emitters of said fifth and sixth transistors respectively.

7. A programmable logic circuit as in claim 6, comprising master and slave circuit sections, each of said sections separately including the elements of claim 6, wherein the junction between the third current source and the emitter of said sixth transistor of said master section is tied to the base electrode of the third transistor of said slave section, each section including an independent programmable fuse and a decode circuit coupled to said fuse for selectively blowing said fuse.

* * * * *